(12) United States Patent
Murata et al.

(10) Patent No.: US 10,217,656 B2
(45) Date of Patent: Feb. 26, 2019

(54) PURGE APPARATUS AND PURGE METHOD

(71) Applicant: MURATA MACHINERY, LTD., Kyoto-shi, Kyoto (JP)

(72) Inventors: Masanao Murata, Ise (JP); Takashi Yamaji, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 294 days.

(21) Appl. No.: 15/120,776

(22) PCT Filed: Jan. 9, 2015

(86) PCT No.: PCT/JP2015/050498
§ 371 (c)(1),
(2) Date: Aug. 23, 2016

(87) PCT Pub. No.: WO2015/141246
PCT Pub. Date: Sep. 24, 2015

(65) Prior Publication Data
US 2016/0365266 A1    Dec. 15, 2016

(30) Foreign Application Priority Data

Mar. 17, 2014  (JP) ................. 2014-052997

(51) Int. Cl.
*H01L 21/00* (2006.01)
*H01L 21/673* (2006.01)
*H01L 21/677* (2006.01)

(52) U.S. Cl.
CPC .. *H01L 21/67393* (2013.01); *H01L 21/67379* (2013.01); *H01L 21/67775* (2013.01)

(58) Field of Classification Search
CPC ......... H01L 21/67393; H01L 21/67379; H01L 21/61115
(Continued)

(56) References Cited

U.S. PATENT DOCUMENTS 6,056,026 A * 5/2000 Fosnight ............... F16K 51/02
141/98
7,726,353 B2 * 6/2010 Okabe ............... H01L 21/67017
141/51
(Continued)

FOREIGN PATENT DOCUMENTS

JP     2010-182747 A    8/2010
JP     2011-187539 A    9/2011
(Continued)

OTHER PUBLICATIONS

Official Communication issued in International Patent Application No. PCT/JP2015/050498, dated Sep. 20, 2016.
(Continued)

*Primary Examiner* — Stephen M Gravini
(74) *Attorney, Agent, or Firm* — Keating & Bennett, LLP

(57) ABSTRACT

A nozzle prevents obstruction of alignment of a container without using an actuator. When the nozzle contacts the container before an alignment member does, the container is guided by a guide surface of the nozzle, the nozzle is lowered by a load applied from the container so that the alignment member contacts the container to align the container, and purge gas is injected from the nozzle into the container.

8 Claims, 4 Drawing Sheets

(58) Field of Classification Search
USPC .......................................................... 34/443
See application file for complete search history.

(56) References Cited

U.S. PATENT DOCUMENTS

| | | | | |
|---|---|---|---|---|
| 7,789,609 B2* | 9/2010 | Okabe | ............... | H01L 21/67772 |
| | | | | 141/51 |
| 7,841,371 B2* | 11/2010 | Okabe | ............... | H01L 21/67017 |
| | | | | 141/51 |
| 8,978,718 B2* | 3/2015 | Emoto | .............. | H01L 21/67017 |
| | | | | 141/51 |
| 9,257,320 B2* | 2/2016 | Fosnight | ........... | H01L 21/67775 |
| 9,824,907 B2* | 11/2017 | Igarashi | ............ | H01L 21/67393 |
| 2008/0260498 A1 | 10/2008 | Nagata et al. | | |
| 2011/0214778 A1* | 9/2011 | Natsume | ........... | H01L 21/67775 |
| | | | | 141/4 |
| 2016/0365266 A1* | 12/2016 | Murata | ............. | H01L 21/67393 |
| 2017/0243776 A1 | 8/2017 | Murata et al. | | |

FOREIGN PATENT DOCUMENTS

| | | | |
|---|---|---|---|
| JP | 2014-036185 A | 2/2014 | |
| WO | 09/50145 A1 | 10/1999 | |

OTHER PUBLICATIONS

Official Communication issued in corresponding European Patent Application No. 15764132.5, dated Oct. 13, 2017.
Official Communication issued in International Patent Application No. PCT/JP2015/050498, dated Feb. 10, 2015.

* cited by examiner

PURGE APPARATUS AND PURGE METHOD

BACKGROUND OF THE INVENTION

1. Field of the Invention

The present invention relates to an apparatus for purging a container such as an FOUP (Front Opening Unified Pod), and to a purge method.

2. Description of the Related Art

In the semiconductor industry, purge gas such as nitrogen gas or clean dry air is injected into containers such as FOUPs that house wafers for purging the containers. When placing a container onto a load port or the like provided with a purge apparatus, the container is aligned with respect to the load port by an alignment member such as a kinematic pin. Then, a nozzle of the load port is brought into close contact with a gas introduction hole of the container, and the purge gas is injected or discharged. The container is not limited to an FOUP for housing wafers but may house other articles such as reticles. Also, the purge apparatus may be provided on a buffer serving as a temporal storage, a stocker having an automated warehouse function, or the like, in addition to load ports.

The height of the gas introduction hole from the bottom surface of the container varies, and for some shapes of the containers, it is necessary to set the upper end of the nozzle to be higher than the upper end of the alignment member. Further, there is a limitation on the alignment accuracy, when placing the containers onto the load ports or the like from an overhead traveling vehicle, a stacker crane, or the like. Therefore, in some cases, the nozzle catches the bottom portion of the container, and this makes it difficult to align the nozzle by the alignment member.

In order to prevent the nozzle from obstructing the alignment of the container, JP 2011-187539 proposes to elevate and lower the nozzle by an actuator; to lower the nozzle when aligning the container; to raise the nozzle after the alignment; and then to fit the nozzle into the gas introduction hole of the container. The actuator is a bellows or the like that expands and contracts by an air pressure cylinder, a motor, or by the pressure of purge gas, for example.

The actuator to raise and lower the nozzle makes the structure of the purge apparatus complicated, and a problem regarding electrical control arises. Further, the adjustment and maintenance of the actuator, and so on become necessary.

SUMMARY OF THE INVENTION

Preferred embodiments of the present invention prevent a nozzle from obstructing alignment of a container without an actuator.

According to a preferred embodiment of the present invention, a purge apparatus for purging by purge gas a container that houses an article and has a gas introduction hole in a bottom portion thereof includes a platform on which the container is placed; a nozzle that protrudes upward from the platform and contacts the gas introduction hole of the container to inject purge gas; and an alignment member that aligns the container.

The nozzle is provided within a side surface of a tip portion thereof with a guide surface that guides the container and the nozzle lowers an upper surface of the nozzle in response to a load applied from the container.

According to another preferred embodiment of the present invention, a purge method of purging by purge gas a container that houses an article and includes a gas introduction hole in a bottom portion thereof with a purge apparatus including a platform on which the container is placed, a nozzle that protrudes upward from the platform and contacts the gas introduction hole of the container to inject purge gas, and an alignment member that aligns the container.

The nozzle is provided within a side surface of a tip portion thereof with a guide surface that guides the container and lowers an upper surface of the nozzle in response to a load applied from the container.

The purge method includes guiding the container via the guide surface of the nozzle, when the nozzle contacts the container before the alignment member does, lowering the upper surface of the nozzle in response to the load applied from the container, and bringing the alignment member and the container into contact; aligning the container by the alignment member; and injecting purge gas from the nozzle into the container.

According to various preferred embodiments of the present invention, in such a case where the nozzle contacts the container before the alignment member does, and the nozzle prevents alignment, the guide surface of the nozzle guides the container, and the upper surface of the nozzle is lowered by a load applied from the container, and thus the alignment member aligns the container. Therefore, an alignment failure does not occur due to the container catching the nozzle. Also, since an actuator is not necessary, the configuration is simple and electrical control is not required, and maintenance, adjustment, and the like are made easy. In the present specification, the descriptions related to the purge apparatus apply to the purge method also.

Preferably, the alignment member includes alignment pins fixed to the platform, protruding upward from the platform, and structure to fit into recesses provided in the bottom portion of the container, and the nozzle is higher than the alignment pins. With this configuration, when the nozzle contacts the bottom portion of the container before the alignment pins do, the container is guided by the guide surface of the nozzle, and simultaneously, the upper surface of the nozzle is lowered, and alignment is performed by the alignment pins.

Preferably, the nozzle is provided with a flat surface on an upper end thereof and causes the flat surface to be inclined by an offset load applied from the gas introduction hole to the nozzle. Here, if the surface of the gas introduction hole and the flat surface of the upper end of the nozzle are not parallel, a portion of the flat surface of the nozzle contacts the gas introduction hole, and the offset load is applied from the gas introduction hole to the nozzle. This offset load makes the flat surface of the upper end of the nozzle inclined and brings the upper surface into uniform contact with the gas introduction hole without a gap. Therefore, purge gas is prevented from leaking.

Preferably, the nozzle is further provided at a lower portion thereof with a pedestal and an elastic member that biases the pedestal upward, and the nozzle is lowered by deformation of the elastic member with application of a load to the elastic member and causes the flat surface of the upper end of the nozzle to be inclined by deformation of the elastic member with application of the offset load to the elastic member. With this configuration, when the load from the container is applied to the nozzle, the elastic member is compressed and the nozzle is lowered, and further when the offset load is applied to the flat surface of the upper end of the nozzle, the elastic member is non-uniformly compressed and the flat surface inclines. Thus, the flat surface of the upper end of the nozzle and the gas introduction hole of the container fit to each other.

The nozzle is preferably further provided with a hollow shaft connecting the tip portion including the guide surface and the pedestal, and a ring-shaped elastic spacer having an L-shaped structure in cross section along a radial direction thereof, the platform is provided with a through hole through that the hollow shaft passes and the through hole has a larger diameter than the hollow shaft has, the hollow shaft has a smaller diameter than the tip portion has, and a bottom surface of the tip portion is exposed in a flange shape and surrounds the hollow shaft, the elastic member is positioned between the bottom surface of the tip portion and the platform and biases the tip portion upward, and one side of the L-shaped structure of the elastic spacer is located in the through hole, and another side of the L-shaped structure is located between the pedestal and a bottom surface of the platform. This simple and small configuration allows the nozzle to be lowered and inclined.

Preferably, the nozzle is provided with a ring-shaped elastic gasket on the upper end thereof. The gasket is compressed due to the load from the container, and the upper surface of the nozzle is lowered. Also, the gasket deforms so as to fit to the gas introduction hole of the container, and thus prevents purge gas from leaking.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
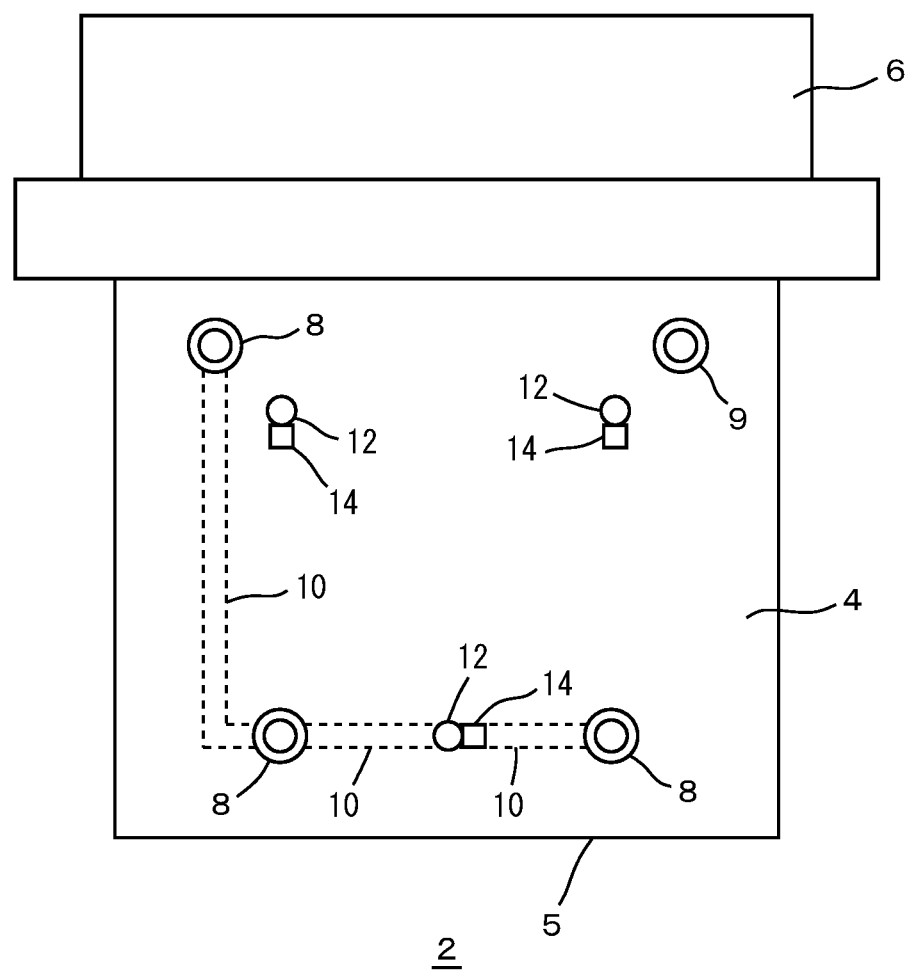
FIG. 1 is a plan view of a load port according to a preferred embodiment of the present invention.

The following describes preferred embodiments of the present invention. The scope of the present invention shall be determined based on the claims, with reference to the description in the specification and well known arts, and in accordance with the understandings of the skilled person in the art.

FIGS. 1 to 6 show a preferred embodiment of the present invention and modifications thereof. FIGS. 1 to 4 show the present preferred embodiment. Reference numeral 2 indicates a load port provided with a purge apparatus according to the present preferred embodiment. Note that the purge apparatus may be provided on a buffer to temporarily store a container, a stocker having an automated warehouse function, and so on. The load port 2 is provided with a horizontal reference surface 4 (a platform on which to place a container), which supports the bottom surface 26 of an FOUP 20. The container is not limited to an FOUP, but may be other containers having a gas introduction hole for purging therein and able to be aligned by an alignment member of the purge apparatus. The load port 2 is provided with a transfer apparatus 6 that opens the lid of the FOUP 20, takes semiconductor wafers into or out of the FOUP 20 one by one, and transfers them to or from an unshown processing equipment or the like.

On the horizontal reference surface 4 of the load port 2, purge gas injection nozzles 8 and a discharge nozzle 9 are provided. The discharge nozzle 9 may not be provided. The nozzles 8 and 9 have the same configuration except that their gas flow directions are opposite. In the following, the nozzles 8 will be mainly described, but the same applies to the nozzle 9.

The nozzles 8 are supplied with purge gas from pipes 10, and the nozzle 9 is connected to an unshown exhaust pipe or the like. On the horizontal reference surface 4, for example, three kinematic coupling pins 12 (hereinafter, pins 12") are provided and are provided to couple coupling grooves 24 of the container. The types of the alignment members are arbitrary. In the present preferred embodiment, the locations at which the alignment members align the container are not important, but it is important that the upper ends of the nozzles 8 and 9 are located higher than the upper ends of the pins 12. Reference numeral 14 indicates an occupation sensor which detects that a FOUP 20 has been placed onto the horizontal reference surface 4 (hereinafter, "reference surface 4") and is used, for example, for turning the flow of purge gas to the pipes 10 on and off.

Figure 2:
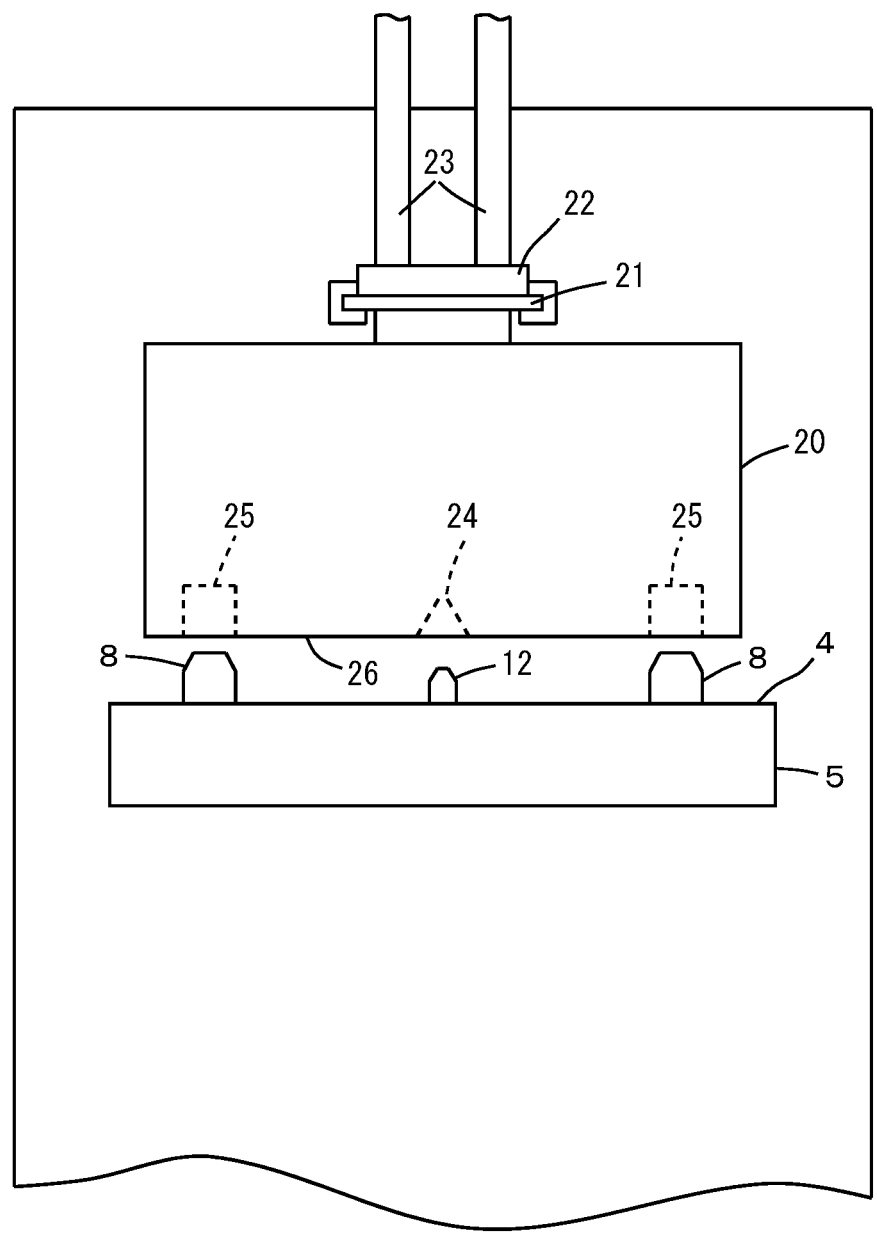
FIG. 2 is a front view of a primary portion of the load port according to a preferred embodiment of the present invention.

FIG. 2 shows a FOUP 20 in the course of being placed onto the reference surface 4. A top flange 21 of the FOUP 20 is held by a chuck of an elevation platform 22 of an unshown overhead traveling vehicle, and the elevation platform 22 is supported by the overhead traveling vehicle with suspending members such as belts 23. The position of the FOUP 20 varies according to the stopping accuracy of the overhead traveling vehicle, and vibrations of the building and swinging of the belts 23 further vary the position. In order to eliminate the variations, the pins 12 are coupled with the coupling grooves 24 provided in the bottom surface 26 of the FOUP 20. However, since the upper ends of the nozzles 8 and 9 are located higher than the upper ends of the pins 12, the nozzles 8 and 9 may catch nozzle receivers 25, and this makes it difficult to align the nozzles 8 and 9 correctly. Note that the reference numeral 5 indicates a base of the load port 2, and the upper surface thereof is the reference surface 4.

Figure 3:
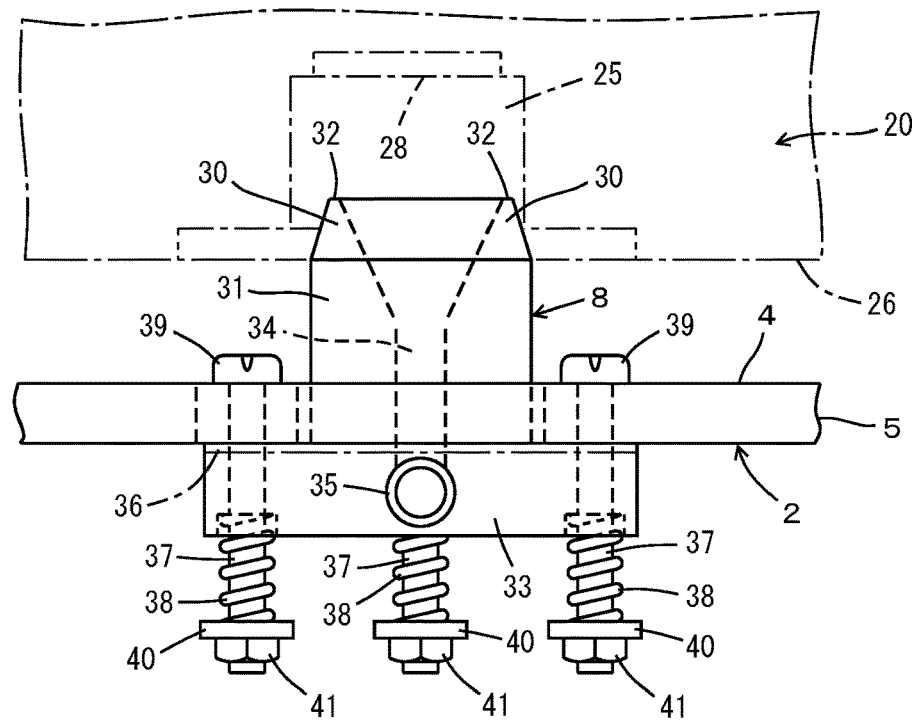
FIG. 3 is a front view of a primary portion of the load port in a state where nozzles have been attached thereto.
Figure 4:
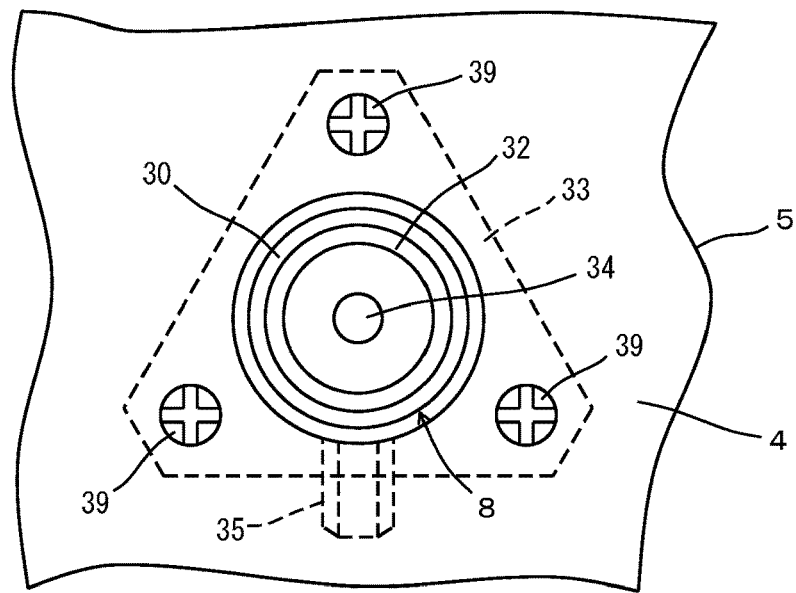
FIG. 4 is a plan view of a primary portion of the load port, showing a nozzle and its surroundings.

FIGS. 3 and 4 show the configuration of the nozzles 8 according to the present preferred embodiment, and the nozzle 9 has the same configuration. A tapered guide surface 30 becoming thinner at the tip is provided on the upper portion of the nozzle 8, and a flat surface 32 is provided on the upper end of the nozzle 8. Reference numeral 33 indicates a pedestal. A flow channel 34 is provided through the center of the nozzle 8 and is connected to the pipe 10 shown in FIG. 1 via a connector 35. In the present preferred embodiment, the upper surface of the pedestal 33 is in direct contact with the bottom surface of the base 5, while an elastic spacer 36 may be provided therebetween. Plural screw shafts 37 penetrate through the pedestal 33, and the pedestal 33 is biased upward by plural springs 38. Reference numeral 39 indicates screw heads, reference numeral 40 indicates receivers supporting one end of springs 38, and reference numeral 41 indicates nuts.

The guide margin of the guide surface 30 is determined according to variations of the loading position of the FOUP 20. The guide surface 30 is preferably made of a low-friction material, has a smooth and hard surface so that abrasion dust is not generated, and generates little outgas. For example, stainless steel, PEEK (poly-ether-ether-ketone), polyethylene, polyacetal, and fluororesin are preferable as the material, and a guide surface 30 made of stainless steel coated by fluororesin is particularly preferable. The flat surface 32 is preferably flat and smooth, and a mirror polished flat surface 32 made of stainless steel is particularly preferable. The springs 38 may be replaced with cylindrical elastic members made of synthetic rubber or the like. In the present preferred embodiment, the pedestal 33 is biased upward by the springs 38 at plural positions so that the pedestal 33 is able to be lowered within a stroke of the order of several millimeters, the nozzles 8 are able to be inclined according to the surface of a gas introduction hole, and the nozzle 9 is able to be inclined according to the surface of a gas discharge hole.

The bottom surface 26 of the FOUP 20 is supported by the reference surface 4 and includes a gas introduction hole corresponding to the nozzle 8. A nozzle receiver 25 is provided with an unshown gas discharge hole corresponding to the nozzle 9. As shown in FIG. 3, consider a case where the FOUP 20 is lowered with a displacement from the correct position. Then, while the guide surface 30 contacts the nozzle receiver 25 before the pins 12 contact with the coupling grooves 24, the FOUP 20 is guided to the correct position by the guide surface 30, and the nozzle 8 is lowered due to the weight of the FOUP 20. Therefore, while the FOUP 20 may catch the nozzles 8 at the beginning, the FOUP 20 is then aligned by the pins 12 and the coupling grooves 24 shown in FIGS. 1 and 2. Further, since the guide surface 30 is made of a low-friction material and is smooth, it has a low friction against the nozzle receivers 25 and so on. Also, due to its hardness, the guide surface 30 generates little amount of abrasion dust.

When the placement of the FOUP 20 is completed, a portion of the weight of the FOUP 20 is supported by the nozzles 8 and 9, and the remaining weight is supported by the pins 12 and the reference surface 4. If the surfaces of the gas introduction holes 28 are not horizontal, it is difficult for the gas introduction holes 28 to fit the flat surfaces 32. The nozzles 8 are 9 are configured to be lowered and are each supported by springs 38 at plural positions. Therefore, when one portion of the flat surface 32 contacts the gas introduction holes 28, then some of springs 38 are offsetly loaded and are compressed, and the nozzles 8 and 9 swing. In other words, the nozzles 8 and 9 rotate about horizontal axes, and consequently, the flat surfaces 32 are brought into uniform contact with the gas introduction holes 28. At this time, the flat surfaces 32 are inclined relative to the horizontal plane, fill the gaps between the flat surfaces 32 and the gas introduction holes 28 and thus prevent purge gas from leaking. Furthermore, since the nozzles 8 and 9 are able to be lowered and raised, variations in the height of the nozzles 8 and 9 and variations in the depth of the nozzle receivers 25 are accommodated.

The present preferred embodiment preferably includes the following features.

1) If the FOUP 20 is lowered while being displaced, the FOUP 20 is guided by the guide surfaces 30 of the nozzles 8 and 9, the nozzles 8 and 9 are lowered due to the load of the FOUP 20, the pins 12 are brought into contact with the coupling grooves 24, and thereafter the FOUP 20 is aligned by the pins 12. Therefore, an alignment failure does not occur due to the nozzles 8 and 9 being caught in the nozzle receivers 25 or the like. Also, the FOUP 20 is more reliably guided compared to when guided by pins 12 alone.

2) The flat surfaces 32 are able to be inclined relative to the horizontal plane when offset pressure is applied by the FOUP 20. Therefore, when the surfaces of the gas introduction holes 28 are not horizontal, the flat surfaces 32 and the gas introduction holes 28 are fitted each other, so that purge gas is prevented from leaking.

3) The nozzles 8 and 9 are biased upward and are able to move up and down and to incline (rotate about a horizontal axis). Therefore, when the height of the nozzles 8 and 9 vary, or the depth of the nozzle receivers 25, i.e., the height of the gas introduction holes 28 vary, for example, the flat surfaces 32 are brought into close contact with the gas introduction holes 28.

4) A portion of the weight of the FOUP 20 is applied to the nozzles 8 and 9, and, with about the same force, the flat surfaces 32 are biased toward the gas introduction holes 28. Therefore, the flat surfaces 32 and the gas introduction holes 28 are reliably brought into contact with each other.

5) The above functions are achieved by the guide surfaces 30, the flat surfaces 32, the screw shafts 37, and the springs 38, and an actuator is not required.

In the present preferred embodiment, the upper surface of each pedestal 33 is located on the bottom surface side of the base 5. Conversely, the bottom surface of each pedestal 33 may be supported by the upper surface of the base 5 with an elastic member such as a spacer therebetween. The range of movement of the nozzles 8 may be limited by fixing members such as screws or pins, and each pedestal 33 may be biased upward by the elastic member. In this case, as well, the elastic members that support the nozzles 8 deform in response to the offset load applied to the flat surfaces 32, and the flat surfaces 32 are brought into close contact with the gas introduction holes of the FOUP.

According to the present preferred embodiment, with respect to the nozzles 8 and 9, the pedestal 33 is supported by springs 38 at plural positions so that the flat surface 32 inclines relative to the horizontal plane according to the gas introduction hole 28.

Figure 5:
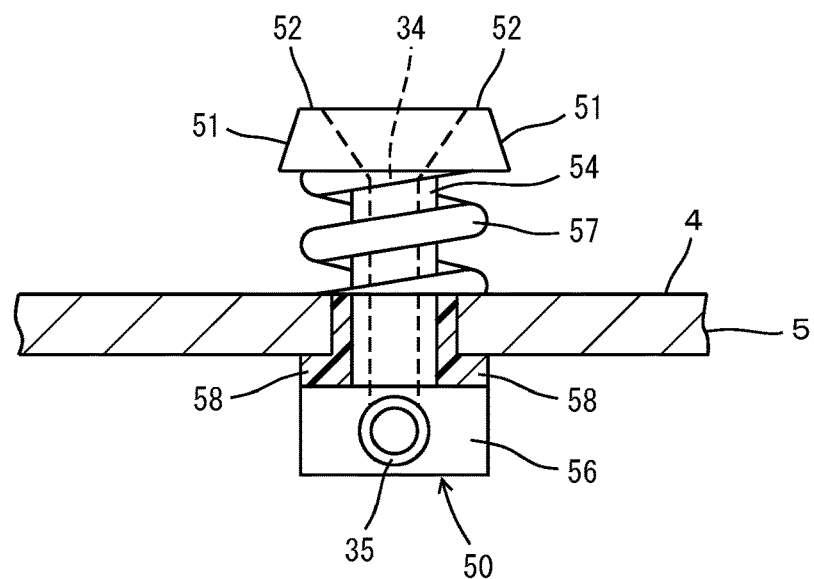
FIG. 5 is a partially-cutaway front view of a primary portion of a load port, showing a nozzle according to a modification of a preferred embodiment of the present invention.

FIG. 5 shows a nozzle 50 according to a modification of a preferred embodiments of the present invention in which support of the pedestal is simplified. Reference numeral 51 indicates a guide surface, reference numeral 52 indicates a flat surface, and they are respectively the same as the guide surface 30 and the flat surface 32 shown in FIGS. 3 and 4. Reference numeral 54 indicates a hollow shaft, reference numeral 56 indicates a pedestal, and reference numeral 57 indicates a spring, which may be an elastic member such as a cylindrical rubber. Reference numeral 58 indicates an elastic spacer, which is located between the base 5 and the nozzle 50 and is compressed due to the elastic force by the spring 57. Note that the nozzle 50 may be a nozzle for purge gas introduction or a nozzle for purge gas discharge.

The FOUP is guided by the guide surface 51 and the flat surface 52 is brought into close contact with the gas introduction hole of the FOUP, similarly to the above-described preferred embodiment. If the flat surface 52 is brought into non-uniform contact with the gas introduction hole, the elastic spacer 58 deforms, the nozzle 50 swings, and thus the flat surface 52 is brought into close contact with the gas introduction hole. Therefore, although the nozzle 50 is supported by the spring 57 at one position, the flat surface 52 is able to be inclined relative to the horizontal plane so as to be brought into close contact with the gas introduction hole.

Figure 6:
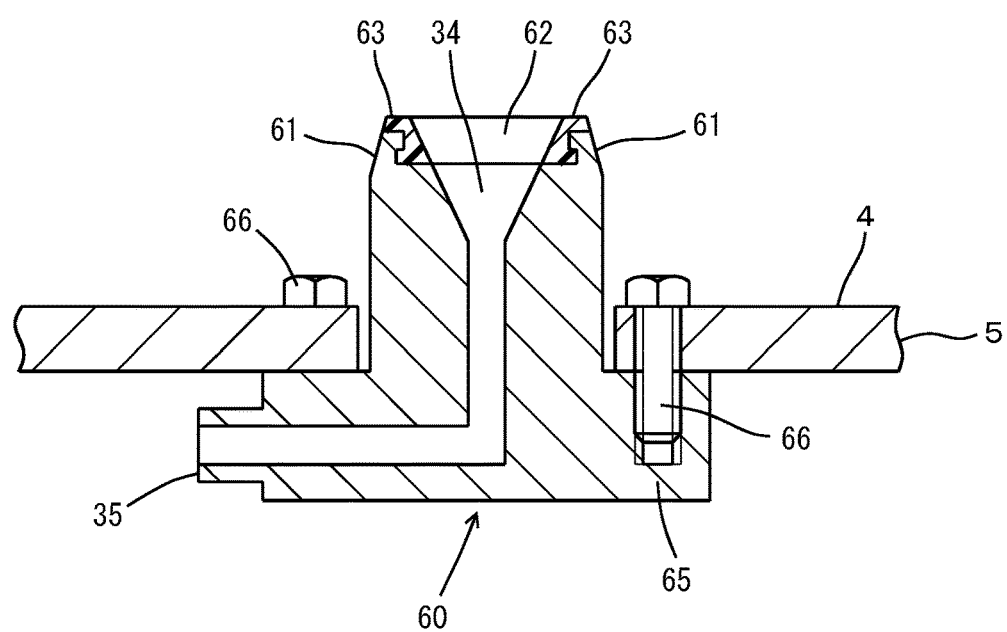
FIG. 6 is a partially-cutaway front view of a primary portion of a load port, showing a nozzle according to a second modification of a preferred embodiment of the present invention.

FIG. 6 shows a nozzle 60 according to a second modification of a preferred embodiment of the present invention that is applicable to both the purge gas introduction nozzle and the purge gas discharge nozzle. Reference numeral 61 indicates a guide surface, and reference numeral 62 indicates a ring-shaped elastic gasket made of synthetic rubber or the like, which is fitted into a tip portion of the nozzle 60 made of metal, for example. The upper surface of the gasket 62 has a flat surface 63. Reference numeral 65 indicates a pedestal fixed to the base 5 with screws 66 or the like, for example. Preferably, the guide surface 61 is smooth and hard, has a low friction, and emits little outgas, similarly to the above-described preferred embodiment. Preferably, the gasket 62 has excellent sealing properties between the gas introduction hole, fluororesin rubber, fluororubber sponge, and rubber or sponge made of polyester or polyurethane are preferable as the material, for example. Further, it is also preferable that the flat surface 63 is flat and has a low surface roughness. Note that the guide surface 61 may be made of the same material as the gasket 62, and the whole upper portion of the nozzle 60 may define and function as a gasket.

The FOUP is guided by the guide surface 61, and in order to bring the gas introduction hole and the flat surface 63 into close contact and also in order to lower the flat surface 63, the flat surface 63 and the surrounding area thereof are made of the elastic gasket 62. When the surface of the gas introduction hole is not horizontal, the gasket 62 deforms and is brought into close contact with the gas introduction hole. With respect to the nozzle 60, the flat surface 63 may be lowered within a narrower area range, and therefore, the nozzles 8 and 9 shown in FIGS. 3 and 4 and the nozzle 50 shown in FIG. 5 are more preferable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A purge apparatus for purging by purge gas a container that houses an article and includes a gas introduction hole in a bottom portion thereof, the purge apparatus comprising:
   a platform on which the container is placed;
   a nozzle that protrudes upward from the platform and contacts the gas introduction hole of the container to inject purge gas; and
   an alignment member that aligns the container; wherein
   a side surface of a tip portion of the nozzle includes a guide surface that guides the container; and
   an upper surface of the nozzle is supported by an elastic member such that the upper surface of the nozzle is lowered in response to a load applied from the container.

2. The purge apparatus according to claim 1, wherein the alignment member includes alignment pins fixed to the platform, protruding upward from the platform, and structured to fit into recesses provided in the bottom portion of the container, and the nozzle is higher than the alignment pins.

3. The purge apparatus according to claim 1, wherein the nozzle is provided with a flat surface on an upper end thereof and causes the flat surface to be inclined by an offset load applied from the gas introduction hole to the nozzle.

4. The purge apparatus according to claim 3, wherein
   the nozzle is further provided at a lower portion thereof with a pedestal and the elastic member that biases the pedestal upward; and
   the nozzle is lowered by deformation of the elastic member with application of the load and causes the flat surface of the upper end of the nozzle to be inclined by deformation of the elastic member when the load applies an offset load to the elastic member.

5. The purge apparatus according to claim 4, wherein
   the nozzle is further provided with a hollow shaft connecting the tip portion including the guide surface and the pedestal, and a ring-shaped elastic spacer including an L-shaped structure in cross section along a radial direction thereof;
   the platform is provided with a through hole through which the hollow shaft passes and the through hole has a larger diameter than the hollow shaft;
   the hollow shaft has a smaller diameter than the tip portion, and a bottom surface of the tip portion is exposed in a flange shape and surrounds the hollow shaft;
   the elastic member is positioned between the bottom surface of the tip portion and the platform and biases the tip portion upward; and
   one side of the L-shaped structure of the elastic spacer is located in the through hole, and another side of the L-shaped structure is located between the pedestal and a bottom surface of the platform.

6. The purge apparatus according to claim 2, wherein the elastic member includes a ring-shaped elastic gasket on an upper end of the nozzle.

7. A purge method purging by purge gas a container that houses an article and includes a gas introduction hole in a bottom portion thereof with a purge apparatus including a platform on which the container is placed, a nozzle that protrudes upward from the platform and contacts the gas introduction hole of the container to inject purge gas, and an alignment member that aligns the container, wherein a side surface of a tip portion of the nozzle includes a guide surface that guides the container, and an upper surface of the nozzle is supported by an elastic member such that the upper surface of the nozzle is lowered in response to a load applied from the container, the purge method comprising:
   guiding the container by the guide surface of the nozzle;
   bringing the nozzle and the container into contact before bringing the alignment member and the container into contact;
   lowering the upper surface of the nozzle in response to the load applied from the container;
   bringing the alignment member and the container into contact;
   aligning the container by the alignment member; and
   injecting purge gas from the nozzle into the container.

8. The purge apparatus according to claim 1, wherein the guide surface is tapered.

* * * * *